United States Patent [19]

West et al.

[11] Patent Number: 5,776,655
[45] Date of Patent: Jul. 7, 1998

[54] PEEL-DEVELOPABLE LITHOGRAPHIC PRINTING PLATE

[75] Inventors: Paul Richard West, Fort Collins; Jeffery Allen Gurney, Greeley, both of Colo.

[73] Assignee: Eastman Kodak Company, Rochester, N.Y.

[21] Appl. No.: 613,931

[22] Filed: Mar. 11, 1996

[51] Int. Cl.$^6$ .................. G03C 11/12; G03C 1/492
[52] U.S. Cl. .................. 430/256; 430/258; 430/271.1; 430/281.1; 430/286.1; 430/302
[58] Field of Search .................. 430/302, 271.1, 430/286.1, 281.1, 256, 258

[56] References Cited

U.S. PATENT DOCUMENTS

| | | | |
|---|---|---|---|
| 4,058,398 | 11/1977 | Osada et al. | 96/27 R |
| 4,153,461 | 5/1979 | Berghauser et al. | 96/75 |
| 4,175,964 | 11/1979 | Yeguda et al. | 430/253 |
| 4,258,122 | 3/1981 | Uchida et al. | 430/253 |
| 4,427,765 | 1/1984 | Mohr et al. | 430/525 |
| 4,980,096 | 12/1990 | Eian et al. | 260/404 |
| 5,045,430 | 9/1991 | Shackle et al. | 430/138 |
| 5,409,798 | 4/1995 | Kondo et al. | 430/203 |
| 5,409,799 | 4/1995 | Uytterhoeven et al. | 430/254 |

FOREIGN PATENT DOCUMENTS

| | | |
|---|---|---|
| 0 487 260 | 5/1992 | European Pat. Off. |
| 0 491 457 | 6/1992 | European Pat. Off. |
| 0 530 674 | 3/1993 | European Pat. Off. |
| 0 568 744 | 11/1993 | European Pat. Off. |
| 0 653 682 | 5/1995 | European Pat. Off. |
| 0 653 684 | 5/1995 | European Pat. Off. |
| 0 653 685 | 5/1995 | European Pat. Off. |
| 0 653 686 | 5/1995 | European Pat. Off. |
| 1530410 | 11/1978 | United Kingdom . |
| WO 94/17452 | 8/1994 | WIPO . |

*Primary Examiner*—Janet C. Baxter
*Assistant Examiner*—Rosemary Ashton
*Attorney, Agent, or Firm*—J. Lanny Tucker

[57] ABSTRACT

A peel-developable lithographic printing plate is comprised of a substrate, a hydrophilic layer comprising a polymeric acid overlying the substrate, a radiation-sensitive image-forming layer overlying the hydrophilic layer and a stripping layer that is strippably adhered to the image-forming layer. The image-forming layer is comprised of a photopolymerizable composition comprising a polymeric binder, a plurality of addition-polymerizable ethylenically-unsaturated compounds at least one of which possesses phosphorus-derived acidic functionality and a photopolymerization initiator. After imagewise exposure of the plate to activating radiation, the stripping layer is peeled from the image-forming layer with only the unexposed regions of the image-forming layer adhering thereto so as to reveal the underlying hydrophilic layer and thereby form a lithographic printing surface.

27 Claims, No Drawings

PEEL-DEVELOPABLE LITHOGRAPHIC PRINTING PLATE

FIELD OF THE INVENTION

This invention relates in general to lithography and in particular to a novel lithographic printing plate which does not require a liquid developer. More specifically, this invention relates to an improved lithographic printing plate of the peel-developable type.

BACKGROUND OF THE INVENTION

In recent years, interest in dry-process lithographic printing plates, i.e. plates which do not require a liquid developer, has been prompted by increasing regulation of the disposal of liquid wastes. A well-known technology which obviates the need for liquid developers makes use of photo-modified adhesion of the photosensitive layer of a printing plate to a cover sheet, which, when peeled off, selectively carries with it either the exposed or non-exposed portions.

Peel-apart development is generally accomplished by laminating a receiver sheet to the printing plate surface with application of heat and pressure. The lamination can be done before or after exposure, although imaging through the receiver presumably degrades resolution. The lamination process introduces constraints upon the choice of materials for the photosensitive layer. For example, the glass transition temperature of binder resins in the photosensitive layer might need to be low enough that the layer will soften under the lamination conditions in order to adhere sufficiently to the receiver. The lamination process itself is not trivial, as any entrained dirt or air bubbles between the receiver and the photosensitive coating can result in incomplete removal of unexposed coating during peel development (in most cases it is the unexposed portion which selectively adheres to the receiver).

Many descriptions of peel-apart lithographic printing plate processes appear in the patent literature, some of which are summarized below:

EP 653,686 (assigned to Agfa-Gevaert) discloses the use of a water-swellable barrier layer between a hydrophilic substrate and a photopolymerizable coating. The barrier layer has the property of being peeled off of the substrate after imaging and laminating the photosensitive layer to a receiver sheet bearing a thermo-adhesive layer. A closely related application is EP 653,685 in which the characteristics of the thermo-adhesive layer are specified with respect to the glass transition temperature and the melt viscosity of the adhesive on the receiver sheet. Also closely related is EP 653,684 in which the thermo-adhesive layer specified in the '685 application is part of the printing plate rather than of the receiver sheet. The examples in these three applications required the use of a heated roll laminator device prior to peel-development and exhibited a maximum "line reproduction" of 8 µm.

Somewhat different from the above is the printing plate described in EP 653,682 (also assigned to Agfa-Gevaert). While the description broadly encompasses the use of a diazo compound as an adhesion promoter between the photopolymerizable layer and the support, the single example demonstrates a process in which the photosensitive layer is imagewise exposed while still part of a temporary support and is then laminated to a hydrophilic receiving element, which becomes the printing plate after peeling away the temporary support. The printing plate is said to be capable of reproducing "dot sizes of up to 95%" and "positive lines of 25 µm." This approach is more generally described in U.S. Pat. No. 5,409,799 (also assigned to Agfa-Gevaert) in which adhesion to the support is enhanced by coating it with a polymer having pendant photopolymerizable functionality. WO 94/17452 (also assigned to Agfa-Gevaert) offers a higher photospeed version of the '799 patent.

EP 568,744 (a signed to Hoechst Celanese) discloses a process of peel-apart development in which the receiver is laminated to the photosensitive layer before imagewise exposure. All the examples show lamination being done at elevated temperature. No resolution information is provided, but it can be expected that interposing the receiver layer between the photosensitive layer and the photomask would result in image degradation.

EP 530,674 (assigned to Canon) describes peel-developable printing plates based upon photopolymerization. The examples, however, show only paper printing plates which are pre-laminated as in the case of EP 568,744. No information is provided about image quality, but the plates are clearly intended for very short run-length applications. EP 487,260 (also assigned to Canon) claims the process of peel-developing plates of similar composition after the plates are already mounted on press. EP 491,457 (also assigned to Canon) provides examples of silver-based pre-laminated printing plates which are laser imaged and flood exposed before peeling apart.

U.S. Pat. No. 5,045,430 (assigned to the Mead Corporation) describes a process of producing printing plates in which a support bearing microcapsules containing a photopolymerizable liquid is imagewise exposed, laminating the exposed sheet to a printing plate substrate with sufficient force to rupture the unexposed capsules, removing the support and flood exposing the printing plate to harden the liquid released by the ruptured capsules.

U.S. Pat. No. 4,980,096 (assigned to 3M) describes the use of photolabile blocked surfactants to selectively release coatings from a variety of substrates, including anodized and silicated aluminum. The exposed areas are selectively removed by the application of a pressure sensitive tape.

U.S. Pat. No. 4,175,964 (assigned to Fuji) describes a peel-developable printing plate in which a support, such as a grained and anodized aluminum support, is treated with an aqueous solution containing a water-soluble oxygen acid or water-soluble oxygen acid salt before coating it with a light-sensitive image-forming composition.

GB 1,530,410 (assigned to Fuji) describes printing plates bearing a layer of a hydrophilic polymer between the anodized aluminum and the light-sensitive layer and a transparent cover film on the photosensitive layer. The examples show polyvinylpyrrolidone, poly(vinyl alcohol) and gelatin as hydrophilic polymers, and in all cases the cover film is a thick (25 µm) polyethylene terphthalate sheet pre-laminated to the photopolymerizable layer. U.S. Pat. No. 4,258,122 (also assigned to Fuji) describes a process of producing a printing plate using particular desensitizers in order to prevent scumming of non-image areas of peel-developed plates. The plates described in the examples have a polyester receiver laminated to the photopolymerizable layer before exposure. U.S. Pat. No. 4,058,398 (also assigned to Fuji) describes a process of forming an image in which it is stipulated that the binder resin is polyvinyl butyral, the sensitizer is selected from the class of naphthothiazoline derivatives and peel-development is done between the temperatures of 70° C. and 150° C.

It is an objective of this invention to provide an improved peel-developable lithographic printing plate which obviates the need for chemical solutions to process the plate, thereby providing savings with respect to the purchase and disposal of developers as well as with respect to the purchase and maintenance of processing equipment. It is a further objective of this invention to provide a peel-developable lithographic printing plate for which laminating equipment is not needed and with which higher quality images are obtained because development is not dependent upon the quality of lamination.

SUMMARY OF THE INVENTION

In accordance with this invention, an improved peel-developable lithographic printing plate is comprised of:

(1) a substrate;

(2) a hydrophilic layer comprising a polymeric acid overlying the substrate;

(3) a radiation-sensitive image-forming layer overlying the hydrophilic layer, the image-forming layer comprising (A) a polymeric binder, (B) a plurality, i.e. two or more, of addition-polymerizable ethylenically-unsaturated compounds at least one of which possesses phosphorus-derived acidic functionality and (C) a photopolymerization initiator; and (4) a stripping layer that is strippably adhered to the image-forming layer; the adhesive and cohesive strengths of each of the stripping layer, image-forming layer and hydrophilic layer being such that upon image-wise exposure of the image-forming layer to activating radiation which causes photopolymerization, the stripping layer is capable of being stripped from the image-forming layer with the unexposed regions of the image-forming layer adhering thereto so as to reveal the underlying hydrophilic layer while the exposed regions of the image-forming layer remain adhered to the hydrophilic layer and the hydrophilic layer remains adhered to the substrate.

Since the stripping layer is an integral part of the lithographic printing plate in this invention, a lamination step is not needed and the problems of entrained dirt or air bubbles that commonly arise in the lamination step are completely avoided.

A key feature of the present invention is the use of a hydrophilic layer which comprises a polymeric acid. A further key feature of the present invention is the use of a plurality of addition-polymerizable ethylenically-unsaturated compounds at least one of which possesses phosphorus-derived acidic functionality. It has been unexpectedly discovered that by use of the combination of these features, it is feasible to achieve the appropriate balance of cohesive and adhesive strengths which permits the stripping layer to be peeled away with only the unexposed regions of the image-forming layer adhering thereto and permits these unexposed regions to be completely removed from the underlying hydrophilic layer so that the problem of scumming, which could otherwise occur when the printing plate is put into use if removal of unexposed regions were incomplete, is effectively avoided. One of the major failings of peel-developable lithographic printing plates of the prior art has been the scumming problem resulting from incomplete removal and the present invention effectively overcomes this very serious problem.

Failure of a peel-developable printing plate of the type described herein can occur in any of several ways. For example, the stripping layer could be only partially removed because of cohesive failure, or the stripping layer could peel away without carrying with it the unexposed regions of the printing plate because of adhesive failure, or the stripping layer could pull off the entire image-forming layer because the adhesive bond of the exposed regions to the stripping layer is of greater strength than to the hydrophilic layer, or the hydrophilic layer could partially or completely separate from the substrate because of cohesive or adhesive failure. All such modes of failure are readily avoided with the present invention as the stripping layer is easily removed to reveal the underlying hydrophilic layer in only the unexposed regions.

In the practice of this invention, the characteristics of the substrate, hydrophilic layer, image-forming layer and stripping layer are so selected, if necessary by trial and error experimentation, to provide the adhesive and cohesive characteristics necessary to avoid failure by any of the modes by which failure is possible.

To facilitate peel development, the stripping layer utilized in this invention can be provided with a suitable pull-tab that can be conveniently gripped to strip off the stripping layer. Alternatively, peel development can be carried out by contacting the stripping layer with an adhesive element, such as a strip of adhesive tape, which adheres thereto with sufficient strength to enable the stripping layer to be stripped off and carry with it the unexposed regions of the image-forming layer.

The improved peel-developable lithographic printing plate of this invention has many advantages in comparison with the prior art. Thus, for example, no lamination step is required so the user does not have to purchase and maintain laminating equipment. The problems of entrained dirt or air bubbles which plague many of the prior art systems are completely avoided and, as a consequence, very high quality images are obtained. The printing plate can be exposed by any one of many suitable techniques, such as by direct laser exposure or by use of a mask, and image formation can be achieved without requiring the services of a skilled operator. The printing plate is amenable to low-cost large-scale commercial production and can make use of known substrates that are already commonly employed in the lithographic printing industry.

DETAILED DESCRIPTION OF THE INVENTION

As hereinabove described, the improved peel-developable lithographic printing plate of this invention is comprised of four essential components, namely (1) a substrate, (2) a hydrophilic layer, (3) an image-forming layer and (4) a stripping layer.

The substrate, which represents the first essential component of the printing plate, can be selected from any of a very wide range of materials having suitable stiffness characteristics and dimensional stability characteristics. Thus, for example, suitable substrates include metals, polymeric films such as films composed of polyethylene terephthalate, polyethylene naphthalate, poly-1,4-cyclohexanedimethylene terephthalate, polyvinyl chloride, polyimide, polycarbonate, polystyrene, cellulose acetate, cellulose acetate butyrate and the like, and paper coated with one or more polymer layers such as polyethylene-coated paper. Particularly preferred substrates for use in this invention include zinc, anodized aluminum, grained aluminum, and aluminum which has been both grained and anodized.

Aluminum has been used for many years as a support for lithographic printing plates and is particularly preferred for use with the printing plates of this invention. In order to prepare the aluminum for such use, it is typical to subject it to both a graining process and a subsequent anodizing process. The graining process serves to improve the adhesion of the subsequently applied radiation-sensitive coating and to enhance the water-receptive characteristics of the background areas of the printing plate. The graining affects both the performance and the durability of the printing plate, and the quality of the graining is a critical factor determining the overall quality of the printing plate. A fine, uniform grain that is free of pits is essential to provide the highest quality performance.

Both mechanical and electrolytic graining processes are well known and widely used in the manufacture of lithographic printing plates. Optimum results are usually achieved through the use of electrolytic graining, which is also referred to in the art as electrochemical graining or electrochemical roughening, and there have been a great many different processes of electrolytic graining proposed for use in lithographic printing plate manufacturing. Processes of electrolytic graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,538,683, 4,564,429, 4,582,996, 4,618,405, 4,735,696, 4,897,168 and 4,919,774.

In the manufacture of lithographic printing plates, the graining process is typically followed by an anodizing process, utilizing an acid such as sulfuric or phosphoric acid. The anodization step serves to provide an anodic oxide layer and is preferably controlled to create a layer of at least 0.3 g/m$^2$. Processes for anodizing aluminum to form an anodic oxide coating are well known in the art and are described, for example, in U.S. Pat. Nos. 2,594,289, 2,703,781, 3,227,639, 3,511,661, 3,804,731, 3,915,811, 3,988,217, 4,022,670, 4,115,211, 4,229,266 and 4,647,346.

Aluminum which has been both grained and anodized is preferably employed as the substrate in the peel-developable printing plates of this invention.

The second essential component of the improved peel-developable lithographic printing plates of this invention is a hydrophilic layer which comprises a polymeric acid.

In the present invention, it is particularly preferred that the hydrophilic layer be composed of a copolymer of about 40 to about 90 mole percent vinylphosphonic acid and about 10 to about 60 mole percent acrylamide. Such copolymers and their use as hydrophilic barrier layers for lithographic printing plates having aluminum supports are described in Walls et al. U.S. Pat. No. 5,368,974, issued Nov. 29, 1994. As described in the '974 patent, aluminum and aluminum oxide are neither oleophilic nor hydrophilic. They are referred to as amphipathic. Hence, lithographic printing plates typically utilize a barrier layer which will render the aluminum surface, and thus the background or non-image area of the printing plate, hydrophilic.

Many hydrophilic barrier layers are known in the lithographic printing plate art. Those which comprise a polymeric acid that provides the necessary cohesive and adhesive strength can be utilized in this invention as the hydrophilic layer which overlies the substrate. Since the hydrophilic layer in the peel-developable plates of this invention must comprise a polymeric acid, such common barrier layers as a sodium silicate layer are not useful.

As explained in the '974 patent, polymers containing phosphonic acid groups have been found to be especially beneficial in forming hydrophilic barrier layers in lithographic printing plates and use of such polymers has been described in at least the following references:

(1) Use of polyvinyl phosphonic acid, a copolymer of vinylphosphonic acid and acrylic acid or a copolymer of vinylphosphonic acid and vinyl acetate to treat aluminum which has not been anodized is proposed in U.S. Pat. No. 3,220,832. The process utilized is one which does not employ electric current.

(2) Use of polyvinyl phosphonic acid to treat anodized aluminum is proposed in U.S. Pat. No. 4,153,461. Again, the process utilized is one which does not employ electric current.

(3) Use of a mixture of polyvinyl phosphonic acid and sodium silicate to treat aluminum in either a thermal or electrochemical process is proposed in U.S. Pat. No. 4,376,814.

(4) Use of an electrolyte solution containing a water-soluble organic acid, such as polyvinyl phosphonic acid and a phosphorus oxo acid to treat aluminum in an electrochemical process employing pulsed direct current is proposed in U.S. Pat. No. 4,383,897.

(5) Use of a water-soluble polybasic organic acid, such as polyvinyl phosphonic acid, to treat aluminum in an electrochemical process employing pulsed direct current is proposed in U.S. Pat. No. 4,399,021.

(6) Use of a reaction product of polyvinyl phosphonic acid and a salt of a divalent metal cation to treat aluminum, with or without an anodic coating of aluminum oxide, in a thermal process is proposed in U.S. Pat. No. 4,427,765.

(7) Use of an electrolyte solution containing a water-soluble organic acid, such as polyvinyl phosphonic acid and a phosphorus oxo acid to treat aluminum in a direct current electrochemical process is proposed in U.S. Pat. No. 4,448,647.

(8) Use of a water-soluble polybasic organic acid, such as polyvinylphosphonic acid, to treat aluminum in a direct current electrochemical process is proposed in U.S. Pat. No. 4,452,674.

(9) Use of polyvinyl methylphosphinic acid to treat anodized aluminum in a thermal process is proposed in U.S. Pat. No. 4,458,005.

(10) Use of a mixture of polyvinyl phosphonic acid and sufficient base to form an electrolyte with a pH of 3 to 10 to treat aluminum in an electrochemical process is proposed in U.S. Pat. No. 4,578,156.

(11) Use of polyvinyl phosphonic acid, a copolymer of vinylphosphonic acid and acrylic acid, a copolymer of vinylphosphonic acid and vinyl acetate or a copolymer of vinylphosphonic acid and acrylamide to treat anodized aluminum in a thermal process in which the aluminum oxide layer is treated with a silicate and then with a solution containing the polymer or copolymer is proposed in U.S. Pat. No. 4,689,272.

(12) Use of a homopolymer of acrylamide isobutylene phosphonic acid or a copolymer of acrylamide isobutylene phosphonic acid and acrylamide to treat aluminum with or without an anodic coating of aluminum oxide in a thermal or electrochemical process is proposed in South African Patent Specification No. 860,876.

While the above references describe representative polymers containing phosphonic acid groups which are especially useful in the hydrophilic layer of this invention, other polymeric acids can also be usefully employed. For example, satisfactory results have been obtained with the use of poly(styrene sulfonic acid). However, it is particularly preferred to use the copolymer and electrochemical application process of the '974 patent to form the hydrophilic layer in the printing plates of this invention.

The third essential component of the improved peel-developable lithographic printing plates of this invention is a radiation-sensitive image-forming layer which overlies the hydrophilic layer. The radiation-sensitive image-forming layer comprises a photopolymerizable composition containing (A) a polymeric binder, (B) a plurality of addition-polymerizable ethylenically-unsaturated compounds at least one of which posseses phosphorus-derived acidic functionality and (C) a photopolymerization initiator.

The polymeric binder incorporated in the image-forming layer can be any one or more of a very wide range of film-forming polymers. Useful film-forming binders include styrene-butadiene copolymers; silicone resins; styrene-alkyd resins; silicone-alkyd resins; soy-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals), such as poly(vinyl butyral); polyacrylic and -methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly(ethylene-co-alkaryloxyalkylene terephthalate); phenolformaldehyde resins; ketone resins; polyamides; polycarbonates; polythiocarbonates, poly(ethylene 4,4'-isopropylidenediphenylene terephthalate); copolymers of vinyl acetate such as poly(vinyl-m-bromobenzoate-co-vinyl acetate); ethyl cellulose, poly(vinyl alcohol), cellulose acetate, cellulose nitrate, chlorinated rubber and gelatin.

Particular advantages are achieved by the use of acetal polymers as the film-forming binder. Examples of useful acetal polymers are those described in U.S. Pat. Nos. 4,652,604, 4,741,985, 4,940,646, 5,169,897 and 5,169,898.

In U.S. Pat. No. 4,652,604, the acetal polymer contains acetal groups of three types, namely six-membered cyclic acetals, five-membered cyclic acetals and intermolecular acetals. In U.S. Pat. No. 4,741,985, the acetal polymer is a mono-acetal containing a six-membered cyclic acetal group. In U.S. Pat. No. 4,940,646, the acetal polymer contains vinyl acetal units derived from an aldehyde that contains hydroxyl groups. In U.S. Pat. No. 5,169,897 the acetal polymer is a binary acetal polymer comprised of recurring units which include two six-membered cyclic acetal groups, one of which is unsubstituted or substituted with an alkyl or hydroxyalkyl group and the other of which is substituted with an aromatic or heterocyclic moiety. In U.S. Pat. No. 5,169,898 the acetal polymer is a ternary acetal polymer comprised of recurring units which include three six-membered cyclic acetal groups, one of which is unsubstituted or substituted with an alkyl or hydroxyalkyl group, another of which is substituted with an aromatic or heterocyclic moiety, and a third of which is substituted with an acid group, an acid-substituted alkyl group or an acid-substituted aryl group.

A particularly preferred binder for use in this invention is the acid-substituted ternary acetal polymer described in Example 1 of U.S. Pat. No. 5,169,898, which is referred to hereinafter as binder ATAP.

The term "photopolymerization" is used herein in a broad sense to include photocrosslinking and photodimerization of macromolecules as well as to describe the photoinduced initiation of vinyl polymerization.

Any of a very broad range of addition-polymerizable ethylenically-unsaturated compounds can be utilized in this invention. Examples include acrylates, methacrylates, acrylamides, methacrylamides, allyl compounds, vinyl ethers, vinyl esters, N-vinyl compounds, styrenes, itaconates, crotonates, maleates and the like. The addition-polymerizable ethylenically-unsaturated compound can be a monomer, a pre-polymer such as a dimer, trimer or other oligomer, a homopolymer, a copolymer, or mixtures thereof.

Acrylic compounds are especially useful as the addition-polymerizable ethylenically-unsaturated compound. Useful acrylic compounds include mono-functional monomers and polyfunctional monomers. Examples of monofunctional acrylic monomers that are useful in the compositions of this invention include acrylic and methacrylic esters such as ethyl acrylate, butyl acrylate, 2-hydroxypropyl acrylate, cyclohexyl acrylate, 2-ethylhexyl acrylate, methyl methacrylate, ethyl methacrylate, and the like. Examples of polyfunctional acrylic monomers that are useful include:
neopentylglycol diacrylate
pentaerythritol triacrylate
1,6-hexanediol diacrylate
trimethylolpropane triacrylate
tetraethylene glycol diacrylate
1,3-butylene glycol diacrylate
trimethylolpropane trimethacrylate
1,3-butylene glycol dimethacrylate
ethylene glycol dimethacrylate
pentaerythritol tetraacrylate
tetraethylene glycol dimethacrylate
1,6-hexanediol dimethacrylate
ethylene glycol diacrylate
diethylene glycol diacrylate
glycerol diacrylate
glycerol triacrylate
1,3-propanediol diacrylate
1,3-propanediol dimethacrylate
1,2,4-butanetriol trimethacrylate
1,4-cyclohexanediol diacrylate
1,4-cyclohexanediol dimethacrylate
pentaerythritol diacrylate
1,5-pentanediol dimethacrylate, and the like.

Preferred polyfunctional acrylic monomers are those of the formula:

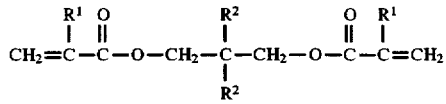

wherein each $R^1$ is independently selected from the group consisting of a hydrogen atom and an alkyl group of 1 to 2 carbon atoms, and each $R^2$ is independently selected from the group consisting of an alkyl group of 1 to 6 carbon atoms and a radical of the formula:

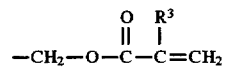

in which $R^3$ is a hydrogen atom or an alkyl group of 1 to 2 carbon atoms.

Poly(alkylene glycol)diacrylates are also especially useful in the present invention as the addition-polymerizable ethylenically-unsaturated compound. Examples are compounds represented by the following formula:

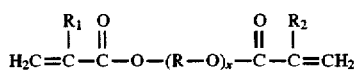

wherein R is an alkylene radical of 2 to 4 carbon atoms, $R_1$ and $R_2$ are independently H or $CH_3$, and x is an integer having a value of from 3 to 50.

Included among the useful poly(alkylene glycol) diacrylates are those comprising ethyleneoxy, propyleneoxy or butyleneoxy groups. As indicated by the above formula, the terminal groups can be acrylate or methacrylate groups.

The photopolymerizable compositions utilized in this invention can include a photocrosslinkable polymer. Typical of such photocrosslinkable polymers are those containing the photosensitive group —CH=CH—CO— as an integral part of the polymer backbone, especially the p-phenylene diacrylate polyesters. These polymers are described, for example, in U.S. Pat. Nos. 3,030,208, 3,622,320, 3,702,765 and 3,929,489. A typical example of such a photocrosslinkable polymer is the polyester prepared from diethyl p-phenylenediacrylate and 1,4-bis(β-hydroxyethoxy) cyclohexane.

The peel-developable lithographic printing plates of this invention require incorporation in the image-forming layer of a plurality of addition-polymerizable ethylenically-unsaturated compounds at least one of which possesses phosphorus-derived acidic functionality. Preferably, the image-forming layer comprises at least one addition-polymerizable ethylenically-unsaturated compound which possesses phosphorus-derived acidic functionality and at least one addition-polymerizable ethylenically-unsaturated compound which is free of phosphorus-derived acidic functionality in order to provide the appropriate balance of adhesive and cohesive characteristics. More preferably, these compounds are employed in amounts such that the compound or compounds possessing phosphorus-derived acidic functionality constitute from 5 to 50 percent of the total weight of addition-polymerizable ethylenically-unsaturated compounds and more preferably from 10 to 40 percent. Any of the addition-polymerizable ethylenically-unsaturated compounds hereinabove described can be modified to include phosphorus-derived acidic functional groups for use herein as the addition-polymerizable ethylenically-unsaturated compound having phosphorus-derived acidic functionality.

The required phosphorus-derived acidic functionality can be provided by any type of phosphorus-derived acidic group. Most preferably, the phosphorus-derived acidic group is a phosphoric, phosphonic or phosphinic acid group.

Particularly preferred for use as the addition-polymerizable ethylenically-unsaturated monomer having phosphorus-derived acidic functionality are acrylic-functionalized phosphate esters such as bis(2-methacryloyloxyethyl)hydrogen phosphate and the phosphate of caprolactone-modified 2-hydroxyethyl methacrylate.

The photopolymerization initiator utilized in this invention is preferably an initiator system comprised of a spectral sensitizer and one or more co-initiators. Any of a very broad range of spectral sensitizers can be used for this purpose. Preferred sensitizers are those which sensitize in the ultraviolet or visible regions of the spectrum. Examples of preferred spectral sensitizers are coumarins, fluoresceins, fluorones, xanthenes, merocyanines, thioxanthones, isoalloxanines and the like.

Particularly preferred spectral sensitizers for use in this invention are 3-substituted coumarins as described in Specht et al, U.S. Pat. No. 4,147,552, issued Apr. 3, 1979. These coumarins have an absorptive maximum between about 250 and about 550 nm. As described in the '552 patent, they can be represented by the formula:

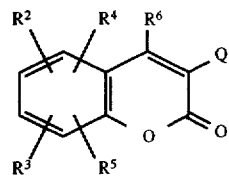

wherein Q is —CN or —Z—R$^1$; Z is carbonyl, sulfonyl, sulfinyl or arylenedicarbonyl;

R$^1$ is alkenyl; alkyl having 1–12 carbon atoms, aryl of 6–10 nuclear carbon atoms; a carbocyclic group of 5–12 carbon atoms; or a heterocyclic group having 5–15 nuclear carbon and hetero atoms;

R$^2$, R$^3$, R$^4$ and R$^5$ each independently is hydrogen, alkoxy having 1–6 carbon atoms, dialkylamino with each alkyl of the dialkylamino group having 1–4 carbon atoms, halogen, acyloxy, nitro, a 5- or 6-membered heterocyclic group, or a group having the formula:

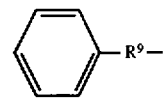

wherein R$^9$ is an alkylene radical having from 1–5 carbon atoms;

R$^6$ is hydrogen, alkyl having 1–4 carbon atoms, aryl of 6–10 carbon atoms; and wherein two or three of R$^2$–R$^5$ and the nuclear carbon atoms to which they are attached can together form a fused ring or fused ring system, each ring being a 5- to 6-membered ring.

Typical examples of useful 3-substituted coumarins include:
3-benzoyl-5,7-dimethoxycoumarin
3-benzoyl-7-methoxycoumarin
3-benzoyl-6-methoxycoumarin
3-benzoyl-8-ethoxycoumarin
7-methoxy-3-(p-nitrobenzoyl)coumarin
3-benzoylcoumarin
3-(p-nitrobenzoyl)coumarin
3-benzoylbenzo[f]coumarin
3,3'-carbonylbis(7-methoxycoumarin)
3-acetyl-7-methoxycoumarin
3-benzoyl-6-bromocoumarin
3,3'-carbonylbiscoumarin
3-benzoyl-7-dimethylaminocoumarin
3,3'-carbonylbis(7-diethylaminocoumarin)
3-carboxycoumarin
3-carboxy-7-methoxycoumarin
3-methoxycarbonyl-6-methoxycoumarin
3-ethoxycarbonyl-6-methoxycoumarin
3-ethoxycarbonyl-7-methoxycoumarin
3-methoxycarbonyl-7-methoxycoumarin
3-acetylbenzo[f]coumarin
3-acetyl-7-methoxycoumarin
3-(1-admantoyl)-7-methoxycoumarin
3-benzoyl-7-hydroxycoumarin
3-benzoyl-6-nitrocoumarin
3-benzoyl-7-acetoxycoumarin
3-[3-(p-ethoxyphenyl)acryloyl]-7-methoxycoumarin
3-benzoyl-7-diethylaminocoumarin
7-dimethylamino-3-(4-iodobenzoyl)coumarin
7-diethylamino-3-(4-iodobenzoyl)coumarin
3,3'-carbonylbis(5,7-diethoxycoumarin)

3-(2-benzofuroyl)-7-(1-pyrrolidinyl)coumarin
7-diethylamino-3-(4-dimethylaminobenzoyl)coumarin
7-methoxy-3-(4-methoxybenzoyl)coumarin
3-(4-nitrobenzoyl)benzo[f]coumarin
3-(4-ethoxycinnamoyl)-7-methoxycoumarin
3-(4-dimethylaminocinnamoyl)coumarin
3-(4-diphenylaminocinnamoyl)coumarin
3-[(3-methylbenzothiaz]-2-ylidene)acetyl]coumarin
3-[(1-methylnaphtho[1,2-d]thiazol-2-ylidene)acetyl]-coumarin
3,3'-carbonylbis(6-methoxycoumarin)
3,3'-carbonylbis(7-acetoxycoumarin)
3,3'-carbonylbis(7-dimethylaminocoumarin)
3,3'-carbonylbis(5,7-di-isopropoxycoumarin)
3,3'-carbonylbis(5,7-di-n-propoxycoumarin)
3,3'-carbonylbis(5,7-di-n-butoxycoumarin)
3,3'-carbonylbis[5,7-di(2-phenylethoxy)coumarin]
3,3'-carbonylbis[5,7-di(2-chloroethoxy)coumarin]
3-cyano-6-methoxycoumarin
3-cyano-7-methoxycoumarin
7-methoxy-3-phenylsulfonylcoumarin
7-methoxy-3-phenylsulfinylcoumarin
1,4-bis(7-diethylamino-3-coumarylcarbonyl)benzene
7-diethylamino-5', 7'-dimethoxy-3,3'carbonylbiscoumarin
7-dimethylamino-3-thenoyl coumarin
7-diethylamino-3-furoyl coumarin
7-diethylamino-3-thenoyl coumarin
3-benzoyl-7-(1-pyrrolidinyl)coumarin
3-(4-fluorosulfonyl)benzoyl-7-methoxycoumarin
3-(3-fluorosulfonyl)benzoyl-7-methoxycoumarin
5,7,6'-trimethoxy-3,3'-carbonylbiscoumarin
5,7,7'-trimethoxy-3,3'-carbonylbiscoumarin
7-diethylamino-6'-methoxy-3,3'-carbonylbiscoumarin
3-nicotinoyl-7-methoxycoumarin
3-(2-benzofuroyl)-7-methoxycoumarin
3-(7-methoxy-3-coumarinoyl)-1-methylpyridinium fluorosulfate
3-(5,7-diethoxy-3-coumarinoyl)-1-methylpyridinium fluoroborate
N-(7-methoxy-3-coumarinoylmethyl)pyridinium bromide
3-(2-benzofuroyl)-7-diethylaminocoumarin
7-(1-pyrrolidinyl)-3-thenoylcoumarin
7-methoxy-3-(4-pyridinoyl)coumarin
3,6-dibenzoylcoumarin
N-(7-methoxy-3-coumarinoylmethyl)-N-phenylacetamide and
9-(7-diethylamino-3-coumarinoyl)-1,2,4,5-tetrahydro-3H,6H,10H[1]benzopyrano[9,9a,1-gh]quinolazine-10-one.

Of the coumarin sensitizers, the 3-ketocoumarins are especially preferred for use in this invention.

Among the wide variety of sensitizers suitable for use in this invention, the merocyanine sensitizers containing a constrained alkylamino group are particularly preferred because of their ability to provide high photospeed. Such sensitizers are described, for example, in U.S. Pat. No. 4,921,827 which defines a constrained alkylamino group as a saturated heterocyclic structure containing at least one nitrogen atom which is directly attached to an existing aromatic ring of the merocyanine.

A preferred sensitizer for use in the present invention is 10-(3-(4-diethylamino)phenyl)-1-oxo-2-propenyl)-2,3, 6,7-tetrahydro-1H,5H,11H-(1)benzopyrano(6,7,8-ij)quinolizin-11-one which has the formula:

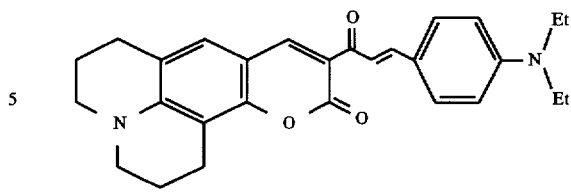

This sensitizer is described in U.S. Pat. Nos. 4,289,844 and 4,366,228, is identified as "Sensitizer A" in U.S. Pat. No. 4,921,827 and is referred to hereinafter as Sensitizer A.

Another preferred sensitizer for use in the present invention is 3,3'-carbonylbis (7-diethylaminocoumarin) which has the formula:

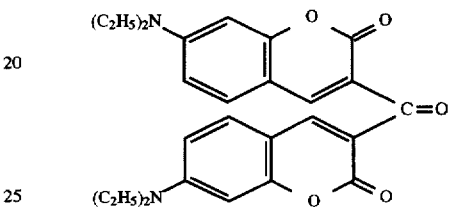

This sensitizer and its synthesis are described in U.S. Pat. No. 4,147,552. It is referred to hereinafter as Sensitizer B.

It is advantageous to use mixtures of spectral sensitizers in this invention and a particularly useful mixture is a mixture of Sensitizer A and Sensitizer B. Sensitizer B is particularly effective when it is desired to expose with an argon-ion laser that emits at 488 nanometers but is not effective for use with a frequency doubled Nd:YAG laser that emits at 532 nanometers. Sensitizer A is equally effective at 488 nanometers and 532 nanometers but its efficiency is significantly less than that of Sensitizer B. By using a mixture of Sensitizers A and B, optimum results are obtained whether the chosen exposure source is an argon-ion laser or a frequency doubled Nd:YAG laser.

Effective co-initiators for use in this invention include N-aryl-α-amino acids such as N-phenylglycine. Preferred co-initiators are the compounds described in copending commonly-assigned U.S. patent application Ser. No. 395,352, now U.S. Pat. No. 5,629,354, filed Feb. 28, 1995. The co-initiators described in application Ser. No. 395,352, now U.S. Pat. No. 5,629,354, are polycarboxylic acid co-initiators comprising an aromatic moiety substituted with a hetero atom selected from nitrogen, oxygen and sulfur and comprising at least two carboxyl groups with at least one of the carboxyl groups being linked to the hetero atom.

By the term "aromatic moiety", as used herein, is meant a mono- or polynuclear hydrocarbon radical, such as a benzene, biphenyl, napthalene or anthracene group. The aromatic moiety is substituted with a nitrogen, oxygen or sulfur atom so that the compounds can be referred to as N-aryl, O-aryl or S-aryl polycarboxylic acids. In addition to being substituted with a nitrogen, oxygen or sulfur atom, the aromatic moiety can optionally include one or more additional substituents.

The N-aryl polycarboxylic acids comprise an N-aryl nucleus which can be represented by the formula:

wherein Ar is a substituted or unsubstituted aryl group. Similarily, the O-aryl polycarboxylic acids comprise an O-aryl nucleus which can be represented by the formula:

and the S-aryl polycarboxylic acids comprise an S-aryl nucleus which can be represented by the formula:

The polycarboxylic acids utilized in this invention include within their structure at least two carboxyl groups with at least one of the carboxyl groups being linked to the hetero atom. Thus, the O-aryl and S-aryl polycarboxylic acids have a carboxyl group linked to the oxygen or sulfur atom, respectively, and one or more carboxyl groups linked to the Ar group.

The N-aryl polycarboxylic acids can have one carboxyl group linked to the nitrogen atom and one or more carboxyl groups linked to the Ar group, or they can have two carboxyl groups linked to the nitrogen atom and no carboxyl groups linked to the Ar group, or they can have two carboxyl groups linked to the nitrogen atom and one or more carboxyl groups linked to the Ar group. When the nitrogen atom is substituted with only one carboxyl group, the other substituent on the nitrogen atom can be hydrogen or a monovalent organic radical such as an alkyl group.

N-aryl polycarboxylic acid co-initiators are especially effective in this invention and examples of preferred N-aryl polycarboxylic acid co-initiators include those of the following formulae I, II, III, IV and V:

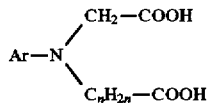

wherein Ar is a substituted or unsubstituted aryl group and n is an integer with a value of from 1 to 5.

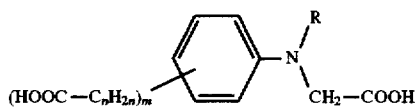

wherein n is an integer with a value of from 1 to 5,
m is an integer with a value of from 1 to 5, and
R is hydrogen or an alkyl group of 1 to 6 carbon atoms.

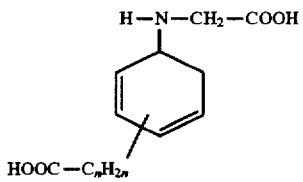

wherein n is an integer with a value of from 1 to 5.

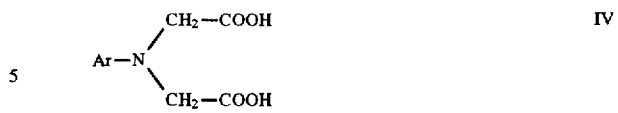

wherein Ar is a substituted or unsubstituted aryl group.

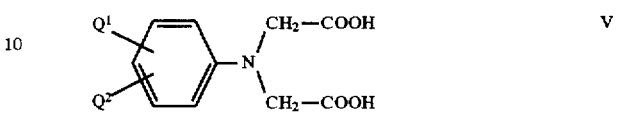

wherein $Q^1$ and $Q^2$ are independently hydrogen, alkyl, alkoxy, thioalkyl, aryl, aryloxy or halogen.

Preferably $Q^1$ and $Q^2$ are independently selected from the group consisting of hydrogen, methyl, ethyl, propyl, butyl, methoxy, ethoxy, propoxy, butoxy, thiomethyl, thioethyl and chloro.

In the most preferred embodiment of the invention, the co-initiator is anilinediacetic acid which has the formula:

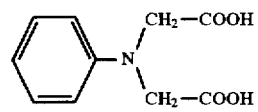

This compound can also be referred to as N-phenyliminodiacetic acid or as N-(carboxymethyl)-N-phenylacetic acid.

Specific examples of N-aryl, O-aryl and S-aryl polycarboxylic acids that can be used as co-intiators in this invention include:
anilinediacetic acid
(p-acetamidophenylimino)diacetic acid
3-(bis(carboxymethyl)amino)benzoic acid
4-(bis(carboxymethyl)amino)benzoic acid
2-|(carboxymethyl)phenylamino|benzoic acid
2-|(carboxymethyl)methylamino|benzoic acid
2-|(carboxymethyl)methylamino]-5-methoxybenzoic acid
3-|bis(carboxymethyl)amino|-2-naphthalenecarboxylic acid
N-(4-aminophenyl)-N-(carboxymethyl)glycine
N,N'-1,3-phenylenebisglycine
N,N'-1,3-phenylenebis[N-(carboxymethyl)]glycine
N,N'-1,2-phenylenebis[N-(carboxymethyl)]glycine
N-(carboxymethyl)-N-(4-methoxyphenyl)glycine
N-(carboxymethyl)-N-(3-methoxyphenyl)glycine
N-(carboxymethyl)-N-(3-hydroxyphenyl)glycine
N-(carboxymethyl)-N (3-chlorophenyl)glycine
N-(carboxymethyl)-N-(4-bromophenyl)glycine
N-(carboxymethyl)-N-(4-chlorophenyl)glycine
N-(carboxymethyl)-N-(2-chlorophenyl)glycine
N-(carboxymethyl)-N-(4-ethylphenyl)glycine
N-(carboxymethyl)-N-(2,3-dimethylphenyl)glycine
N-(carboxymethyl)-N-(3,4-dimethylphenyl)glycine
N-(carboxymethyl)-N-(3,5-dimethylphenyl)glycine
N-(carboxymethyl)-N-(2,4-dimethylphenyl)glycine
N-(carboxymethyl)-N-(2,6-dimethylphenyl)glycine
N-(carboxymethyl)-N-(4-formylphenyl)glycine
N-(carboxymethyl)-N-ethylanthranilic acid
N-(carboxymethyl)-N-propylanthranilic acid
5-bromo-N-(carboxymethyl)anthranilic acid
N-(2-carboxyphenyl)glycine
o-dianisidine-N,N,N',N'-tetraacetic acid
N,N'-|1,2-ethanediylbis(oxy-2,1-phenylene)|bis |N-(carboxymethyl)glycine|
4-carboxyphenoxyacetic acid
catechol-O,O'-diacetic acid 4-methylcatechol-O,O'-diacetic acid
resorcinol-O,O'-diacetic acid
hydroquinone-O,O'-diacetic acid
α-carboxy-o-anisic acid
4,4'-isopropylidenediphenoxyacetic acid
2,2'-(dibenzofuran-2,8-diyldioxy)diacetic acid
2-(carboxymethylthio)benzoic acid
5-amino-2-(carboxymethylthio)benzoic acid
3-[(carboxymethyl)thio]-2-naphthalenecarboxylic acid In addition to the spectral sensitizer and polycarboxylic acid co-initiator, it is particularly preferred to include in the photopolymerization initiator system of this invention a second co-initiator selected from the group consisting of (1) iodonium salts, (2) titanocenes, (3) haloalkyl-substituted s-triazines, (4) hexaaryl bisimidazoles, (5) photooxidants containing a heterocyclic nitrogen atom that is substituted by either an alkoxy group or an acyloxy group such as, for example, the N-alkoxypyridinium salts, and (6) alkyltriarylborate salts. As explained in the aforesaid copending commonly-assigned U.S. patent application Ser. No. 395,352, now U.S. Pat. No. 5,629,354 the use of one or more of the aforesaid second co-initiators improves the performance of the photopolymerizable composition in terms of meeting the dual requirements of high photospeed and good shelf-life.

Preferred iodonium salts for use in this invention are iodonium salts of the formula:

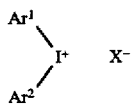

in which $Ar^1$ and $Ar^2$ independently represent substituted or unsubstituted aromatic groups and $X^-$ represents an anion.

Particularly preferred iodonium salts for use in this invention are diaryl iodonium salts of the formula:

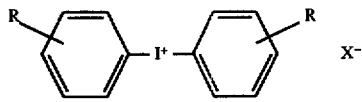

wherein each R is independently hydrogen, halogen, alkyl, alkoxy or nitro and X is an anion such as $Cl^-$, $BF_4^-$, $PF_6^-$, $AsF_6^-$ or $SbF_6^-$.

Specific examples of iodonium salts that are useful in this invention include:
diphenyliodonium hexafluorophosphate
4-octyloxyphenylphenyliodonium hexafluorophosphate
bis(dodecylphenyl)iodonium hexafluoroantimonate
4-isooctyloxyphenylphenyliodonium hexafluorophosphate,
diphenyliodonium trifluoromethanesulfonate
4-octyloxyphenylphenyliodonium tosylate
4,4'-di-t-butyl-diphenyliodonium hexafluorophosphate
4-butoxyphenylphenyliodonium trifluoroacetate
diphenyliodonium naphthalenesulfonate
3,3'-dinitrodiphenyliodonium hexafluorophosphate
4,4'-dichlorodiphenyliodonium tosylate
4-methoxyphenylphenyliodonium tetrafluoroborate and the like.

Titanocenes which are especially useful as a second co-initiator in the photopolymerization initiator system of this invention include those described in U.S. Pat. No. 5,306,600. Of particular interest is the titanocene compound bis(η5-2, 4-cyclopentadienyl-1-yl)-bis{2,6-difluoro-3-(1H-pyrrol-1-yl)phenyl}titanium which has the following formula:

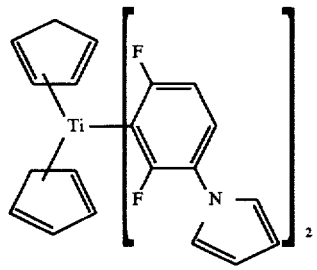

Another class of compounds that are useful as a second co-initiator in the present invention are the photooxidants described in U.S. Reissue Pat. No. 28,240, the disclosure of which is incorporated herein by reference. These are photooxidants which contain a heterocyclic nitrogen atom that is substituted by either an alkoxy group or an acyloxy group. As described in U.S. Pat. No. Re 28,240 typical photooxidants of this class are represented by one of the formulas:

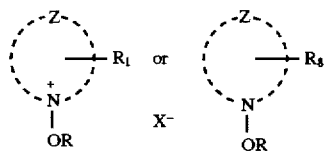

wherein $R_1$ can be any of the following:

a. a methine linkage terminated by a heterocyclic nucleus of the type contained in cyanine dyes, e.g., those set forth in Mees and James, "The Theory of the Photographic Process," Macmillan, 3rd ed, pp. 198–232; the methine linkage can be substituted or unsubstituted, e.g., $-CH=$, $-C(CH_3)=$, $-C(C_6H_5)=$, $-CH=CH-$, $-CH=CH-CH=$, etc.;

b. an alkyl radical preferably containing one to eight carbon atoms including a substituted alkyl radical;

c. an aryl radical including a substituted aryl radical such as a phenyl radical, a naphthyl radical, a tolyl radical, etc.;

d. a hydrogen atom;

e. an acyl radical having the formula:

wherein $R_9$ is hydrogen or an alkyl group preferably having one to eight carbon atoms;

f. an anilinovinyl radical such as a radical having the formula:

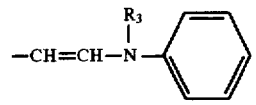

wherein $R_3$ is hydrogen, acyl or alkyl, or g. a styryl radical including substituted styryl radicals, e.g.,

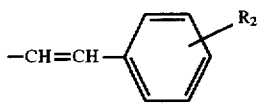

wherein R₂ is hydrogen, alkyl, aryl, amino, including dialkylamino such as dimethylamino;

R₈ can be either of the following:

a. a methine linkage terminated by a heterocyclic nucleus of the type contained in merocyanine dyes, e.g., those set forth in Mees and James (cited above); the methine linkage can be substituted or unsubstituted; or b. an allylidene radical including a substituted allylidene radical such as a cyanoallylidene radical, an alkylcarboxyallylidene radical or an alkylsufonylallylidene radical;

R can be either:

a. an alkyl radical preferably having one to eight carbon atoms such as methyl, ethyl, propyl, butyl, etc., including a substitued alkyl radical such as sulfoalkyl, e.g., —(CH₂)₃SO₃—, an aralkyl, e.g., benzyl or pyridinatooxyalkyl salt, e.g., —(CH₂)₃—O—Y wherein Y is substituted or unsubstituted pyridinium salt; etc., b. an acyl radical, e.g.,

wherein R₄ is an alkyl radical preferably having one to eight carbon atoms or aryl radical, e.g., methyl, ethyl, propyl, butyl, phenyl, naphthyl, etc.

Z represents the atoms necessary to complete a five- to six-membered heterocyclic nucleus, which nucleus can contain at least one additional heteroatom such as oxygen, sulfur, selenium or nitrogen, e.g., a pyridine nucleus, a quinoline nucleus, etc.; and X⁻ represents an acid anion, e.g., chloride, bromide, iodide, perchlorate, sulfamate, thiocyanate, p-toluenesulfonate, methyl sulfate, tetrafluoroborate, etc.

Examples of photooxidants of the class described in Reissue U.S. Pat. No. Re 28,240 which are especially preferred for use in this invention include:

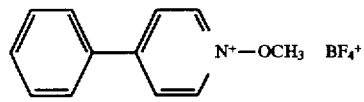

N-methyl-4-phenylpyridinium tetrafluoroborate

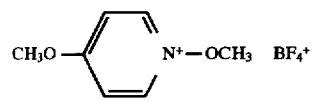

N-4-dimethoxypyridinium tetrafluoroborate

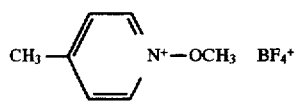

N-methoxy-4-methylpyridinium tetrafluoroborate

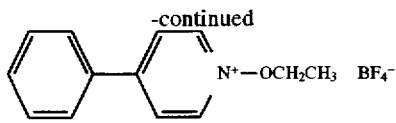

N-ethoxy-4-phenylpyridinium tetrafluoroborate

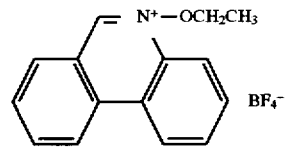

N-ethoxyphenanthridinium tetrafluoroborate

Of the photooxidants of Reissue U.S. Pat. No. Re 28,240, those that are most preferred for use in the present invention are the N-alkoxypyridinium salts.

Haloalkyl-substituted s-triazines are also useful as a second co-initiator in the present invention. Preferred haloalkyl-substituted s-triazines for use in this invention are compounds of the formula:

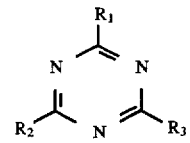

wherein R₁ is a substituted or unsubstituted aliphatic or aromatic radical and R₂ and R₃ are, independently, haloalkyl groups.

In the above formula, it is especially preferred that R₂ and R₃ are haloalkyl groups of 1 to 4 carbon atoms.

Particularly preferred haloalkyl-substituted s-triazines for use in this invention are compounds of the formula:

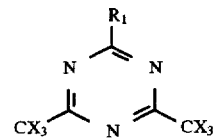

wherein R₁ is a substituted or unsubstituted aliphatic or aromatic radical and each X is, independently, a halogen atom.

A specific example of a preferred haloalkyl-substituted s-triazine for use in this invention is 2,4,6-tris (trichloromethyl)-s-triazine.

Hexaaryl bisimidazoles represent a further class of compounds that are useful as a second co-initiator in the present invention. An example of a useful hexaaryl bisimidazole is the compound 2,2'-bis(o-chlorophenyl)-4,4',5,5'-tetraphenylbisimidazolyl which has the formula:

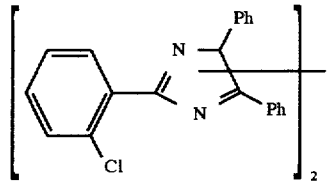

wherein Ph represents a phenyl group.

Alkyltriarylborate salts represent a still further class of compounds that are useful as a second co-initiator in the present invention. The alkyltriarylborate salts which are especially useful are salts of the formula:

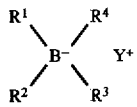

wherein each of $R^1$, $R^2$ and $R^3$ is, independently, an aryl group of 6 to 12 carbon atoms, $R^4$ is an alkyl group of 1 to 12 carbon atoms, and Y is a counterion such as ammonium, tetramethylammonium or an alkali metal. The three aryl groups are preferably phenyl or lower alkyl substituted phenyl groups such as tolyl and xylyl. The alkyl group is preferably lower alkyl such as methyl, ethyl or n-butyl.

Iodonium salts are particularly useful in this invention because of their ability to both substantially improve photospeed and substantially improve shelf-life. Thus, a composition containing both an N-aryl, O-aryl or S-aryl polycarboxylic acid and an iodonium salt represents a preferred embodiment of the invention. Incorporating a titanocene in the composition, in addition to the iodonium salt and the polycarboxylic acid, affords additional photospeed which is not obtainable by simply increasing the concentration of either the iodonium salt or the polycarboxylic acid.

Preferred iodonium salts for use in this invention are the non-toxic alkoxy-substituted salts described in U.S. Pat. Nos. 4,882,201, 4,981,881, 5,010,118, 5,082,686 and 5,144,051. These compounds are preferably utilized as the hexafluorophosphate salt rather than the hexafluoroantimonate salt when the lithographic printing plate utilizes an aluminum support. The reason for such preference is that the incomparability of the hexafluoroantimonate counter-ion with the aluminum substrate harms the shelf-life of the plate.

In the photopolymerizable compositions of this invention, the spectral sensitizer is typically used in an amount of from about 0.001 to about 0.1 parts per part by weight of the combination of addition-polymerizable ethylenically-unsaturated compounds, while the polycarboxylic acid co-initiator is typically used in an amount of from about 0.05 to about 0.5 parts per part by weight of the combination of addition-polymerizable ethylenically-unsaturated compounds. When a second co-initiator is employed, it is typically used in an amount of from about 0.05 to about 0.5 parts per part by weight of the combination of addition-polymerizable ethylenically-unsaturated compounds.

In the present invention, the optimum coating thickness of the radiation-sensitive layer will depend upon such factors as the particular application to which the printing plate will be put, and the nature of other components which may be present in the coating. Typical coating thicknesses can be from about 0.05 to about 10.0 micrometers or greater, with thicknesses of from 0.1 to 2.5 micrometers being preferred. The stripping layer is preferably also very thin, preferably having a thickness on the order of only 1 to 2 micrometers. This allows for greatly improved resolution compared to that possible with peel-developable lithograpic printing plates that are exposed through a relatively thick laminated receiver sheet.

The stripping layer, which represents the fourth essential component of the printing plate, can be any layer with cohesive and adhesive strength characteristics such that it is strippably removable from the underlying image-forming layer and that when stripped away it carries with it only the unexposed regions of the image-forming layer.

In the present invention, it is particularly preferred that the stripping layer be composed of polyvinyl alcohol, and especially a fully hydrolyzed polyvinyl alcohol. The polyvinyl alcohols provide excellent stripping performance and also have the advantage that they serve as an oxygen barrier layer which serves to prevent quenching of initiating and propagating radicals involved in the photopolymerization process.

Polyvinyl alcohol is obtained through methanolysis of poly(vinyl acetate) catalyzed by sodium hydroxide. Neutralization of the base is used to control the degree of hydrolysis, and fully hydrolyzed polyvinyl alcohol is obtained when the methanolysis reaction is allowed to go to completion. For commercial grades of polyvinyl alcohol, "fully hydrolyzed" is taken to mean 97.5–99.5% degree of hydrolysis, as described by T. Okaya in "General Properties of Polyvinyl Alcohol in Relation to Its Applications" in *Polyvinyl Alcohol-Developments*, C. A. Finch, ed., John Wiley & sons (1992).

Polyvinyl alcohols suitable for use as a stripping layer in this invention are well known commercially available materials. They preferably have an average molecular weight in the range of from about 3,000 to about 120,000. Examples of suitable polyvinyl alcohols include those available in a range of molecular weights from AIR PRODUCTS CORPORATION under the trademarks AIRVOL 107, AIRVOL 203, AIRVOL 205, AIRVOL 523 and AIRVOL 540. Other suitable polyvinyl alcohols include those available from HOECHST-CELANESE under the trademarks MOWIOL 4-88, MOWIOL 4-98, MOWIOL 5-88, MOWIOL 18-88, MOWIOL 26-88, and MOWIOL 40-88. Preferred polyvinyl alcohols for use in this invention are those that are essentially fully hydrolyzed, for example about 98% hydrolyzed, such as AIRVOL 107 or MOWIOL 4-98. Use of fully hydrolyzed polyvinyl alcohols is especially beneficial in providing the combination of cohesive and adhesive strengths necessary for successful practice of the stripping step as well as effective oxygen barrier protection.

Coating compositions utilized in the manufacture of the peel-developable lithographic printing plates of this invention can be prepared by dispersing or dissolving the components in any suitable solvent or combination of solvents. The solvents are chosen to be substantially unreactive toward the components and are chosen to be compatible with the substrate employed for coating. While the best choice of solvent will vary with the exact application under consideration, exemplary preferred solvents include alcohols, such as butanol and benzyl alcohol; ketones, such as acetone, 2-butanone and cylohexanone; ethers such as tetrahydrofuran and dioxane; 2-methoxyethyl acetate; N,N'-dimethylformamide; chlorinated hydrocarbons such as chloroform, trichloroethane, 1,2-dichloroethane, 1,1-dichloroethane, 1,1,2-trichloroethane, dichloromethane, tetrachloroethane, chlorbenzene; and mixtures thereof.

The radiation-sensitive layer of the lithographic printing plates of this invention can contain a variety of optional ingredients such as antioxidants, surfactants, anti-scumming agents and the like.

The radiation-sensitive layer can contain pigments preferably having a maximum average particle size less than about 3 micrometers. These pigments can provide a visible coloration to an image before or after development of the plate. Useful pigments are well known in the art and include titanium dioxide, zinc oxide, copper phthalocyanines, halogenated copper phthalocyanines, quinacridine, and colorants such as those sold commercial under the trade name Hostaperm. The pigments are generally present in the composition in an amount within the rnage of from 0 to about 50 percent (by weight) based on the total dry composition weight. Preferred amounts are within the range of from about 5 to about 20 percent (by weight).

An optional, but preferred, process for imaging the peel-developable lithographic printing plate of this invention includes the steps of a post-exposure bake following the imagewise exposure step in order to strengthen the image and render it more durable and wear resistant and thus capable of providing longer run-life.

The stripping layer utilized in this invention can serve both the function of an oxygen barrier layer and the function of permitting the non-exposed areas of the image-forming layer to be stripped from the underlying hydrophilic layer.

In a particular embodiment of the present invention, a basic compound is incorporated in either the stripping layer or the radiation-sensitive image-forming layer in an amount sufficient to reduce thermal fog susceptibility of the lithographic printing plate. This is in accordance with the teachings of copending commonly assigned United States Provisional patent application Ser. No. 60/001267, filed Jul. 20, 1995.

As described in the aforesaid Provisional patent application Ser. No. 60/001267, a photopolymerizable imaging layer is preferably overcoated with an oxygen barrier layer in order to realize maximum photosensitivity and particularly good results are obtained with oxygen barrier layers composed of polyvinyl alcohol. Use of polyvinyl alcohols which are fully hydrolyzed, for example 98% hydrolyzed, is preferred, in particular because of the improved adhesion of the oxygen barrier layer to the underlying photopolymerizable imaging layer that is achieved. It is believed that the need for fully hydrolyzed polyvinyl alcohol in the oxygen barrier layer to obtain good adhesion is dictated by the presence in the photopolymerizable layer of ionic or zwitterionic materials such as alkoxypyridinium salts, iodonium salts and/or N-aryl, O-aryl or S-aryl polycarboxylic acids. While the use of fully hydrolyzed polyvinyl alcohol effectively avoids the adhesion problem, it results in greatly increased susceptibility to thermal fogging. In particular, the lithographic printing plate has a tendency to incompletely develop in the non-exposed areas if exposed to high temperatures. Such exposure to high temperatures can occur, for example, during storage of the plate. Use of a less than fully hydrolyzed polyvinyl alcohol, for example use of 88% hydrolyzed polyvinyl alcohol, avoids the thermal fogging problem but results in poor adhesion.

The term "basic compound" is used herein in its broadest sense to include any compound that functions as a proton acceptor. It is particularly preferred that the basic compound is incorporated in the stripping layer but, alternatively, it can be incorporated in the radiation-sensitive layer or in both the stripping layer and the radiation-sensitive layer.

Basic compounds which are preferred for use in this invention as agents which reduce thermal fog susceptibility are compounds of the formula:

$$M_x\text{—}R_y$$

wherein M is a cation;
R is —OH, —PO$_4$, —HPO$_4$, —H$_2$PO$_4$, —NO$_2$, —NO$_3$, —SCN, —BF$_4$, —SO$_3$—R$^1$ or —OOC—R$^1$ wherein R$^1$ is hydrogen or a substituted or unsubstituted hydrocarbyl group; and x and y are integers such that x times the valence of M is equal to y times the valence of R.

Basic compounds which are particularly preferred for use in this invention as agents which reduce thermal fog susceptibility are compounds of the formula:

$$M_1\text{—OOC—}R_1$$

wherein M$_1$ is an alkali metal and R$_1$ is an alkyl group or carboxyalkyl group.

The term "hydrocarbyl", as used herein, is intended to cover any organic group that is composed of carbon and hydrogen.

The term "carboxyalkyl", as used herein, is intended to cover alkyl groups substituted with one or more carboxyl groups.

It is particularly preferred that R$_1$ in the above formula represents an alkyl group or carboxyalkyl group of 2 to 12 carbon atoms.

Examples of suitable cations represented by the symbol M include ammonium; alkali metals such as sodium, lithium and potassium; alkaline earth metals such as calcium and magnesium; and tetralkylammonium groups such as tetramethylammonium, tetraethylammonium and methyltriethylammonium. R represents —OH, —PO$_4$, —HPO$_4$, —H$_2$PO$_4$, —NO$_2$, —NO$_3$, —SCN, —BF$_4$, —SO$_3$—R$^1$ or —OOC—R$^1$ wherein R$^1$ is hydrogen or a substituted or unsubstituted hydrocarbyl group preferably of 1 to 20 carbon atoms. The term "hydrocarbyl group" is intended to encompass any organic group composed of carbon and hydrogen including alkyl, cycloalkyl and aryl groups. The hydrocarbyl group can be substituted or unsubstituted. Examples of suitable substituents include carboxyl, halo and alkoxy. Substituents with easily extractable hydrogens, such as hydroxy, can in some instances adversely affect the antifoggant activity of the basic compound.

In the formula M$_x$—R$_y$, x and y are integers such that x times the valence of M is equal to y times the valence of R. Thus, where both the cation and the anion have the same valency, x and y are each equal to 1.

Specific examples of basic compounds which can be utilized in accordance with this invention to reduce thermal fog susceptibility of the printing plates described herein include the following:

sodium hydroxide
lithium hydroxide
potassium hydroxide
ammonium hydroxide
calcium hydroxide
magnesium hydroxide
tetramethylammonium hydroxide
tetraethylammonium hydroxide
methyltriethylammonium hydroxide
monobasic sodium phosphate
dibasic sodium phosphate
tribasic sodium phosphate
monobasic potassium phosphate
potassium nitrite
sodium nitrate
sodium thiocyanate
sodium tetrafluoroborate
sodium salt of sulfanilic acid
magnesium sulfate
sodium salt of 3-chloropropionic acid
lithium benzoate
sodium salt of 3,4,5-trimethoxybenzoic acid
sodium acetate
magnesium acetate
sodium propionate
lithium propionate
potassium propionate
sodium isobutyrate
sodium succinate
sodium glutarate
sodium adipate
monosodium citrate
potassium citrate dibasic ammonium citrate
lithium citrate
monosodium tartrate
monosodium malonate
disodium malonate
disodium succinate
potassium sorbate
disodium fumarate
sodium gallate and the like.

Preferred for use as basic compounds in the present invention are salts of weak acids, preferably weak acids having a pKa of at least about 3, and most preferably a pKa of at least about 5. Acid strengths in water solutions are defined in terms of the equilibrium constant, Ka, for the reaction:

$$HA + H_2O \rightarrow OH_3^+ + A^-$$

pKa is defined by the equation:

$$pKa = -LOG\ Ka \text{ where}$$

$$Ka = \frac{[H_3O^+][A^-]}{[HA]}$$

The smaller the value of Ka, and greater the value of pKa, the weaker the acid.

The lithographic printing plates of this invention are of high sensitivity, such as a sensitivity in the range of from about 50 to about 500 microjoules per square centimeter. They are advantageously designed to have a peak sensitivity at about 488 nanometers to adapt them for exposure with an argon-ion laser or to have a peak sensitivity at about 532 nanometers to adapt them for exposure with a frequency doubled Nd:YAG laser. As hereinabove described, they can be designed to have very high sensitivities at both 488 and 532 nanometers to increase their versatility.

The invention is further illustrated by the following examples of its practice taken in conjunction with the comparative examples which illustrate the improved performance achieved with the novel peel-developable lithographic printing plate of this invention. In the examples, all parts specified are parts by weight.

EXAMPLE 1

A coating formulation was prepared as follows:

| Component | Parts |
| --- | --- |
| 20% copper phthalocyanine pigment dispersion | 3.328 |
| binder ATAP[1] | 1.807 |
| pentaerythritol triacrylate | 1.333 |
| SR 9008[2] | 0.666 |
| Kayamer PM-2[3] | 0.333 |
| 3,3'-carbonyl-bis(5,7-dipropoxy)coumarin | 0.044 |
| BYK-307[4] | 0.011 |
| 3-t-butyl-4-hydroxy-5-methylphenylsulfide | 0.002 |
| 2-butanone | 14.277 |
| toluene | 23.795 |
| 1-methoxy-2-propanol | 54.403 |

[1] Binder ATAP is the acid-substituted ternary acetal polymer described in Example 1 of U.S. Pat. 5,169,898.
[2] SR 9008 is an alkoxylated triacrylate available form Sartomer Corporation
[3] Kayamer PM-2 is bis(2-methacryloyloxyethyl) hydrogen phosphate, available from Nippon Kayaku Corporation.
[4] BYK-307 is a polyether-modified polydimethylsiloxane available from BYK Chemie Corporation.

The above formulation was applied at a dry coating weight of 1.2 g/m² onto aluminum which had been electrochemically grained, anodized in sulfuric acid and post-treated with an acrylamide/vinylphosphonic acid copolymer as described in U.S. Pat. No. 5,368,974. Onto this coating was applied at a dry coating weight of 2.2 g/m² the following composition:

| Component | Parts |
| --- | --- |
| Mowiol 4-98[1] | 4.931 |
| Zonyl FSN[2] | 0.065 |
| Aerosol TO[3] | 0.026 |
| Water | 94.978 |

[1] Mowiol 4-98 is 98% hydrolyzed poly(vinyl alcohol) available from Hoechst-Celanese
[2] Zonyl FSN is a fluorosurfactant available from DuPont.
[3] Aerosol TO is the sodium salt of bis(2-ethylhexyl)sulfosuccinic acid available from American Cyanamid.

The above printing plate was given 15 units of exposure through a 14-step scale with an Olec exposure unit in the high intensity mode and then baked for 1 minute at 100° C. Masking tape was then applied to the coating and the coating was peeled away, revealing the hydrophilic layer with 10 solid image steps.

EXAMPLE 2

A printing plate was prepared as described in Example 1 with 0.311 parts of anilinediacetic acid added as an additional component to the photosensitive layer. The resulting plate was given 2 units of exposure at a low intensity setting through a UGRA test pattern as well as through a 14-step scale. After baking and peeling as in Example 1, eight solid image steps were revealed along with well resolved 4 μm positive lines.

EXAMPLE 3

A printing plate was prepared as described in Example 2, with 0.138 parts of 1-methoxy-4-phenylpyridinium tetrafluoroborate added as an additional component to the photosensitive layer. The resulting plate was given 10 units of exposure at a low intensity setting through a UGRA test pattern as well as through a 14-step scale. After baking and peeling as in Example 1, eight solid image steps were revealed along with well resolved 4 μm positive lines.

EXAMPLE 4

A coating formulation was prepared as follows:

| Component | Parts |
| --- | --- |
| 20% copper phthalocyanine pigment disperion | 3.328 |
| binder ATAP | 1.807 |
| CD 9051[1] | 1.555 |
| SR 9008 | 0.666 |
| 3,3'-carbonylbis(7-diethylaminocoumarin) | 0.044 |
| Anilinediacetic acid | 0.307 |
| Diphenyliodonium hexafluorophosphate | 0.215 |
| CGI-784[2] | 0.333 |
| BYK-307 | 0.011 |
| 3-t-butyl-4-hydroxy-5-methylphenylsulfide | 0.092 |
| 2-butanone | 14.191 |
| toluene | 23.651 |
| 1-methoxy-2-propanol | 54.056 |

[1] CD 9051 is a mixture of bis(2-methacryloyloxyethyl) hydrogen phosphate with ethoxylated trimethylolpropane triacrylate esters available from Sartomer Corporation
[2] CGI-784 is bis(η⁵-2,4-cyclopentadien-1-yl)bis(2,6-difluoro-3-(1H-pyrrol-1-yl)phenyl)-titanium (available from Ciba Geigy Corporation).

The above formulation was used to prepare a printing plate as described in Example 1, with the additional modification of 0.099 parts of sodium propionate added to the overcoat formulation. The plate was imaged as in Example 2 to reveal 10 solid steps and 4 μm positive lines.

EXAMPLE 5

A printing plate was prepared as described in Example 4, except that the diphenyliodonium hexafluorophosphate and CGI-784 were omitted, while the CD 9051 was replaced with 1.333 parts of pentaerythritol triacrylate and 0.444 parts of Kayamer PM-21 (described as the phosphate of caprolactone-modified 2-hydroxyethyl methacrylate, available from Nippon Kayaku Corporation). The plate was imaged as in Example 2 to reveal 7 solid steps and 4 μm positive lines.

EXAMPLE 6

A printing plate was prepared as described in Example 4, except that the diphenyliodonium hexafluorophosphate was replaced with 0.138 parts of 1-methoxy-4-phenylpyridinium tetrafluoroborate and the CD 9051 was replaced with 1.333 parts of pentaerythritol triacrylate and 0.222 parts of Kayamer PM-2. The plate was mounted on a printing press and delivered more than 40,000 impressions.

EXAMPLE 7

A coating formulation was prepared as described in Example 2 except that the pentaerythritol triacrylate was increased from 1.333 parts to 1.777 parts and the Kayamer PM-2 was increased from 0.333 to 0.444 parts to compensate for the omission of the SR 9008. This formulation was applied at a dry coating weight of 1.2 g/m$^2$ onto aluminum which first had been electrochemically grained, anodized in sulfuric acid, post-treated with sodium silicate and coated with poly(styrene sulfonic acid) at a dry coating weight of 0.04 g/m$^2$. The image-forming coating was overcoated at a dry coating weight of 2.2 g/m$^2$ with the polyvinyl alcohol formulation described in Example 1. The resulting plate was imaged and peeled in the manner described in Example 2 to reveal nine solid image steps along with well resolved 6 micrometer positive lines.

Comparative Example 1

A printing plate was prepared as described in Example 2, except that the amount of pentaerythritol triacrylate was increased to 2.221 parts, while omitting the Kayamer PM-2 and the SR 9008. Attempts to reveal the image by peeling after exposing and baking resulted only in the removal of the poly(vinyl alcohol) layer. This example failed because the image-forming layer did not contain an addition-polymerizable ethylenically-unsaturated compound having phosphorus-derived acidic functionality as required by the present invention.

Comparative Example 2

A printing plate was prepared as described in Example 2, except that the amount of Kayamer PM-2 was increased to 2.221 parts, while omitting the pentaerythritol triacrylate and the SR 9008. Attempts to reveal the image by peeling after exposing and baking resulted only in the partial removal of the poly(vinyl alcohol) layer. This example failed because of the omission of both the pentaerythritol triacrylate and the alkoxylated triacrylate.

Comparative Example 3

A printing plate was prepared as described in Example 2, except that 88% hydrolyzed poly(vinyl alcohol) was used instead of 98% hydrolyzed poly(vinyl alcohol). Attempts to reveal the image by peeling after exposing and baking resulted only in the removal of the poly(vinyl alcohol) layer. This example failed because the stripping layer did not have adequate adhesive strength.

Comparative Example 4

A printing plate was prepared as described in Example 3, except that the substrate was post-treated with sodium silicate instead of with the vinylphosphonic acid copolymer. Attempts to reveal the image by peeling after exposing and baking were unsuccessful. This example failed because the hydrophilic layer did not contain a polymeric acid as required by the present invention.

Comparative Example 5

A printing plate was prepared as described in Example 2, except that the amount of Kayamer PM-2 was decreased to 0.044 parts, while the pentaerythritol triacrylate was increased to 2.177 parts. Attempts to reveal the image by peeling after exposing and baking resulted only in the partial removal of the poly(vinyl alcohol) layer. This example failed because of an insufficient amount of addition-polymerizable ethylenically-unsaturated compound having phosphorus-derived acidic functionality in the image-forming layer.

Comparative Example 6

Example 7 was repeated except that the 0.04 g/m$^2$ of poly(styrene sulfonic acid) was replaced with 0.02 g/m$^2$ of poly(acrylic acid). The resulting plate was given 2 units of exposure at a low intensity setting through a UGRA test pattern as well as through a 14-step scale. Application of adhesive tape to the polyvinyl alcohol layer followed by peeling resulted in removal of part of the polyvinyl alcohol, but most of the photosensitive coating remained on the aluminum substrate (the same composition was coated on the substrate described in Example 1 and peeled easily to reveal 10 solid image steps along with well-resolved 4 μm positive lines). This example failed because of excessive adhesion of the photosensitive layer to the poly(acrylic acid) layer.

Comparative Example 7

The photosensitive coating formulation of Comparative Example 6 was applied to the substrate described in Example 1. Onto this coating was applied, at a dry coating weight of 2.2 g/m$^2$, the overcoat formulation described under Example 1 except that the following polymers were substituted for the polyvinyl alcohol:

poly(styrene sulfonic) acid at 2.2 g/m$^2$
polyvinyl pyrrolidone at 2.2 g/m$^2$
poly(acrylic acid) at 2.2 g/m$^2$
poly(ethylene imine) at 1.6 g/m$^2$
hydroxypropyl cellulose at 1.6 g/m$^2$ Attempts to peel the poly(styrene sulfonic) acid, polyvinyl pyrrolidone, poly(acrylic acid) and poly(ethylene imine) with adhesive tape were unsuccessful. The adhesive tape did remove the hydroxpropyl cellulose layer, but the photosensitive layer remained on the aluminum substrate and no image was revealed. These examples failed because the stripping layer did not exhibit an appropriate level of adhesive strength to permit the unexposed areas of the imaging layer to be removed.

The peel-developable lithographic printing plate of this invention is based on the ability to selectively remove the unexposed portions of the image-forming layer after imagewise exposure. This requires that the adhesive and cohesive strengths of each of the stripping layer, image-forming layer and hydrophilic layer are such that upon imagewise exposure of the image-forming layer to activating radiation which causes photopolymerization the stripping layer is capable of being stripped from the image-forming layer with the unexposed regions of the image-forming layer adhering thereto so as to reveal the underlying hydrophilic layer while the exposed regions of the image-forming layer remain adhered to the hydrophilic layer and the hydrophilic layer remains adhered to the substrate. Thus the exposed regions of the image-forming layer become the ink-receptive image and the revealed portions of the hydrophilic layer become the water-receptive background areas. The peel-developable printing plate is extremely easy to use since it requires no lamination step with its attendant risk of defects attributable to dirt or air bubbles and can be immediately put on press following peel development. Moreover, the printing plate is capable of providing excellent image resolution as well as a robust long-wearing image that provides excellent run-life.

The invention has been described in detail with particular reference to certain preferred embodiments thereof, but it will be understood that variations and modifications can be effected within the spirit and scope of the invention.

We claim:

1. A peel-developable lithographic printing plate comprising:
   (1) a substrate;
   (2) a hydrophilic layer comprising a polymeric acid overlying said substrate;
   (3) a radiation-sensitive image-forming layer overlying said hydrophilic layer; said image-forming layer comprising (A) a polymeric binder, (B) a plurality of addition-polymerizable ethylenically-unsaturated compounds at least one of which possesses phosphorus-derived acidic functionality, said one or more compounds possessing phosphorus-derived acidic functionality comprising 5 to 50% of the total weight of addition-polymerizable ethylenically unsaturated compound, and (C) a photopolymerization initiator; and
   (4) a stripping layer that is strippably adhered to said image-forming layer; the adhesive and cohesive strengths of each of said stripping layer, image-forming layer and hydrophilic layer being such that upon imagewise exposure of said image-forming layer to activating radiation which causes photopolymerization said stripping layer is capable of being stripped from said image-forming layer with the unexposed regions of said image-forming layer adhering thereto so as to reveal said underlying hydrophilic layer while the exposed regions of said image-forming layer remain adhered to said hydrophilic layer and said hydrophilic layer remains adhered to said substrate.

2. A peel-developable lithographic printing plate as claimed in claim 1, wherein said substrate is grained and anodized aluminum.

3. A peel-developable lithographic printing plate as claimed in claim 1, wherein said substrate is a polyethylene terephthalate film.

4. A peel-developable lithographic printing plate as claimed in claim 1, wherein said polymeric acid is a polymer containing phosphonic acid groups.

5. A peel-developable lithographic printing plate as claimed in claim 1, wherein said polymeric acid is polyvinylphosphonic acid.

6. A peel-developable lithographic printing plate as claimed in claim 1, wherein said polymeric acid is a copolymer of about 40 to about 90 mole percent vinylphosphonic acid and about 10 to about 60 mole percent acrylamide.

7. A peel-developable lithographic printing plate as claimed in claim 1, wherein said polymeric acid is poly (styrene sulfonic acid).

8. A peel-developable lithographic printing plate as claimed in claim 1, wherein said polymeric binder is an acetal polymer.

9. A peel-developable lithographic printing plate as claimed in claim 1, wherein said addition-polymerizable ethylenically-unsaturated compound having phosphorus-derived acidic functionality contains a phosphoric, phosphonic or phosphinic group.

10. A peel-developable lithographic printing plate as claimed in claim 1, wherein said addition-polymerizable ethylenically-unsaturated compound having phosphorus-derived acidic functionality is an acrylic-functionalized phosphate ester.

11. A peel-developable lithographic printing plate as claimed in claim 1, wherein at least one of said addition-polymerizable ethylenically-unsaturated compounds is an acrylic monomer.

12. A peel-developable lithographic printing plate as claimed in claim 1, wherein one of said addition-polymerizable ethylenically-unsaturated compounds is pentaerythritol triacrylate.

13. A peel-developable lithographic printing plate as claimed in claim 1, wherein the addition-polymerizable ethylenically-unsaturated compound or compounds possessing phosphorus-derived acidic functionality constitute from 10 to 40 percent of the total weight of addition-polymerizable ethylenically-unsaturated compounds.

14. A peel-developable lithographic printing plate as claimed in claim 1, wherein said photopolymerization initiator comprises a spectral sensitizer which is a coumarin, fluorescein, fluorone, xanthene, merocyanine, thioxanthone or isoalloxanine.

15. A peel-developable lithographic printing plate as claimed in claim 1, wherein said photopolymerization initiator comprises a 3-ketocoumarin spectral sensitizer.

16. A peel-developable lithographic printing plate as claimed in claim 1, wherein said photopolymerization initiator comprises a polycarboxylic acid co-initiator comprising an aromatic moiety substituted with a hetero atom selected from nitrogen, oxygen and sulfur and comprising at least two carboxyl groups with at least one of said carboxyl groups being linked to said hetero atom.

17. A peel-developable lithographic printing plate as claimed in claim 16, wherein said photopolymerization initiator includes a second co-initiator selected from the group consisting of iodonium salts, titanocenes, haloalkyl-substituted s-triazines, hexaaryl bisimidazoles, alkyltriarylborate salts and photooxidants containing a heterocylic nitrogen atom that is substituted by either an alkoxy group or an acyloxy group.

18. A peel-developable lithographic printing plate as claimed in claim 1, wherein said stripping layer is composed of fully hydrolyzed polyvinyl alcohol.

19. A peel-developable lithographic printing plate as claimed in claim 18, wherein said stripping layer additionally contains sodium propionate.

20. The printing plate of claim 1 wherein said image-forming layer comprises at least one addition-polymerizable ethylenically unsaturated compound that possesses phosphorus-derived acidic functionality and at least one addition-polymerizable ethylenically unsaturated compound that is free of phosphorus-derived acidic functionality.

21. A peel-developable lithographic printing plate comprising:
   (1) a grained and anodized aluminum substrate;
   (2) hydrophilic layer composed of a copolymer of about 40 to about 90 mole percent vinylphosphonic acid and about 10 to about 60 mole percent acrylamide overlying said substrate;
   (3) a radiation-sensitive image-forming layer overlying said hydrophilic layer, said image-forming layer comprising (A) an acetal polymer, (B) bis(2-methacryloyloxyethyl) hydrogen phosphate, (C) pentaerythritol triacrylate and (D) a 3-ketocoumarin; and
   (4) a stripping layer that is strippably adhered to said image-forming layer, said stripping layer comprising fully hydrolyzed polyvinyl alcohol.

22. A peel-developable lithographic printing plate comprising:
   (1) a grained and anodized aluminum substrate;
   (2) a hydrophilic layer composed of a copolymer of about 40 to about 90 mole percent vinylphosphonic acid and about 10 to about 60 mole percent acrylamide overlying said substrate;
   (3) a radiation-sensitive image-forming layer overlying said hydrophilic layer, said image-forming layer comprising (A) an acetal polymer, (B) bis(2-methacryloyloxyethyl) hydrogen phosphate, (C) pentaerythritol triacrylate, (D) 3,3'-carbonyl-bis(5,7-dipropoxy)coumarin and (E) anilinediacetic acid; and
   (4) a stripping layer that is strippably adhered to said image-forming layer, said stripping layer comprising fully hydrolyzed polyvinyl alcohol.

23. A peel-developable lithographic printing plate comprising:
   (1) a grained and anodized aluminum substrate;
   (2) a hydrophilic layer composed of a copolymer of about 40 to about 90 mole percent vinylphosphonic acid and about 10 to about 60 mole percent acrylamide overlying said substrate;
   (3) a radiation-sensitive image-forming layer overlying said hydrophilic layer, said image-forming layer comprising (A) an acetal polymer, (B) a phosphate of caprolactone-modified 2-hydroxyethyl methacrylate, (C) pentaerythritol triacrylate, (D) 3,3'-carbonylbis(7-diethylaminocoumarin) and (E) anilinediacetic acid; and
   (4) a stripping layer that is strippably adhered to said image-forming layer, said stripping layer comprising fully hydrolyzed polyvinyl alcohol and sodium propionate.

24. A method for the preparation of a lithographic printing plate; said method comprising the steps of:
   (1) providing an element comprising a substrate, a hydrophilic layer overlying said substrate, a radiation-sensitive image-forming layer overlying said hydrophilic layer, and a stripping layer overlying said image-forming layer, said hydrophilic layer comprising a polymeric acid and said image-forming layer comprising (A) a polymeric binder, (B) a plurality of addition-polymerizable ethylenically-unsaturated compounds at least one of which possesses phosphorus-derived acidic functionality, said one or more compounds possessing phosphorus-derived acidic functionality comprising 5 to 50% of the total weight of addition-polymerizable ethylenically unsaturated compound, and (C) a photopolymerization initiator,
   (2) imagewise-exposing said element to activating radiation which hardens said image-forming layer in exposed regions thereof; and
   (3) peeling said stripping layer from said element with only the unexposed regions of said image-forming layer adhering to said stripping layer.

25. A method as claimed in claim 24, wherein said substrate is grained and anodized aluminum, said hydrophilic layer is comprised of a copolymer of vinylphosphonic acid and acrylamide and said stripping layer is comprised of fully hydrolyzed polyvinyl alcohol.

26. A method for the manufacture of a peel-developable lithographic printing plate; said method comprising the steps of
   (1) providing a substrate;
   (2) coating said substrate with a hydrophilic layer comprising a polymeric acid;
   (3) coating said hydrophilic layer with a radiation-sensitive image-forming layer comprising (A) a polymeric binder, (B) a plurality of addition-polymerizable ethylenically-unsaturated compounds at least one of which posesses phosphorus-derived acidic functionality, said one or more compounds possessing phosphorus-derived acidic functionality comprising 5 to 50% of the total weight of addition-polymerizable ethylenically unsaturated compound, and (C) a photopolymerization initiator; and
   (4) coating said image-forming layer with a stripping layer that is strippably adhered thereto.

27. A method as claimed in claim 26, wherein said substrate is grained and anodized aluminum, said polymeric acid is a copolymer of vinylphosphonic acid and acrylamide, said addition-polymerizable ethylenically-unsaturated compound having phosphorus-derived acidic functionality is an acrylic-functionalized phosphate ester, and said stripping layer is comprised of fully hydrolyzed polyvinyl alcohol.

* * * * *